(12) United States Patent
Vancura

(10) Patent No.: US 7,395,464 B2
(45) Date of Patent: Jul. 1, 2008

(54) MEMORY CIRCUIT HAVING A CONTROLLABLE OUTPUT DRIVE

(75) Inventor: Mark D. Vancura, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 193 days.

(21) Appl. No.: 11/051,128

(22) Filed: Feb. 4, 2005

(65) Prior Publication Data

US 2005/0149794 A1 Jul. 7, 2005

Related U.S. Application Data

(62) Division of application No. 10/234,627, filed on Sep. 4, 2002, now Pat. No. 6,886,119.

(51) Int. Cl.
*G11C 29/00* (2006.01)
*G11C 7/00* (2006.01)
(52) U.S. Cl. .................. 714/718; 365/201; 365/189.05
(58) Field of Classification Search ................ 714/718; 365/201
See application file for complete search history.

(56) References Cited

U.S. PATENT DOCUMENTS

| 4,947,357 | A | * | 8/1990 | Stewart et al. ............... 714/726 |
| 6,144,588 | A | * | 11/2000 | Pio et al. ............... 365/189.09 |
| 6,288,947 | B1 | * | 9/2001 | Kim et al. ............. 365/189.05 |
| 6,778,431 | B2 | * | 8/2004 | Gogl et al. .................. 365/171 |
| 6,788,586 | B2 | * | 9/2004 | Confalonieri et al. .. 365/189.05 |

FOREIGN PATENT DOCUMENTS

EP 1221771 A1 * 10/2002

* cited by examiner

*Primary Examiner*—Cynthia Britt

(57) ABSTRACT

A memory circuit having a controllable output drive includes a storage circuit configured for at least temporarily storing a logical state of the memory circuit, and a drive control circuit coupled to the storage circuit. The drive control circuit is configurable for selectively controlling the output drive of the memory circuit.

20 Claims, 2 Drawing Sheets

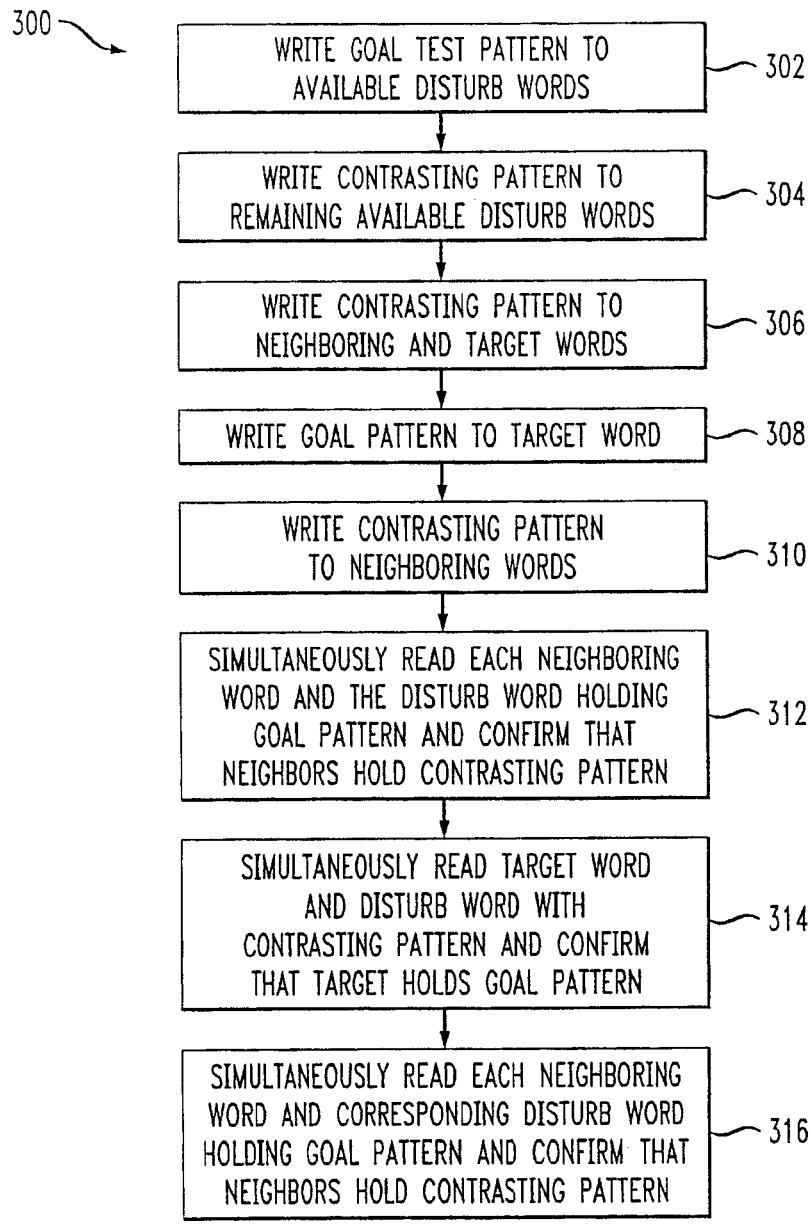
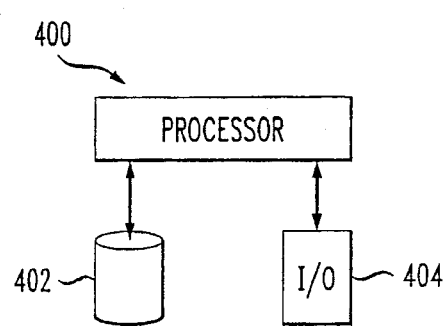

MEMORY CIRCUIT HAVING A CONTROLLABLE OUTPUT DRIVE

CROSS-REFERENCE TO PRIOR APPLICATION(S)

This application is a division of U.S. application Ser. No. 10/234,627 filed on Sep. 4, 2002, which issued as U.S. Pat. No. 6,886,119 on Apr. 26, 2005, the disclosure of which is incorporated by reference herein.

FIELD OF THE INVENTION

The present invention relates generally to memory devices, and more particularly relates to memory circuits having an output drive which is selectively variable.

BACKGROUND OF THE INVENTION

Memory circuits, whether fabricated as separate devices or embedded with other functional circuitry in an IC, present challenging testing issues. With the increased number and size of embedded memories in today's designs comes a dramatically increased possibility of defects and lower yields. IC manufacturing relies on testing at least a representative sample of manufactured devices to ensure that each of the devices reliably performs in accordance with predetermined specifications over the life of the device.

Conventional manufacturing testing of memories (e.g., random access memory (RAM), read-only memory (ROM), etc.) generally fails to detect all defects. More rigorous testing methodologies can typically detect a higher number of failures, but at a significantly increased cost. With this increased cost comes diminishing returns, since the percentage increase in cost for the added testing generally yields only a marginal increase in the number of defects that are detected. Since present manufacturing testing methodologies generally fail to detect an unacceptably high number of defective devices, memory designers are often forced to incorporate substantial robustness in their designs in order to guarantee a desired level of quality.

Many conventional IC memory testing methodologies have been employed to ensure higher quality devices. Some of these conventional testing approaches include built-in self test (BIST), level-sensitive scan design (LSSD) or scan testing, and increased, repeated probabilistic testing. BIST is a testing technique which performs circuit analysis and hardware generation for an embedded structural test methodology, and eliminates the need for external pattern sets. The digital test is typically stored in the function of a circuit included in each device, ensuring that a substantially complete digital test is applied to a memory device or circuit. BIST can quickly find many memory defects. However, shrinking geometries create more types of defects that can be extremely difficult to detect using conventional BIST methods.

In an increased, repeated probabilistic testing approach, the same test (e.g., a BIST) is typically applied to the device repeatedly. Probabilistic testing relies on random electromagnetic noise in the test environment to stress the device differently during each of several test passes, and potentially fail the device on one of the passes. However, this testing approach has only indirect and imprecise control over the noise surrounding a memory during test. In particular, such noise is virtually impossible to control on a bit-by-bit basis and is just as likely to aid an otherwise defective or weak bit, thereby masking detection of a failure. Moreover, the requirement of several repeated passes of the test increases both the time and cost of the manufacturing testing process. Another conventional testing approach is to selectively vary one or more environmental conditions, such as, but not limited to, supply voltage, temperature and clock or access rates. Often, this method aims to stress the memory device well beyond its intended operational range in order to establish a guardband or margin of operation for the device.

Conventional testing approaches generally fail to ensure a desired device quality in a cost-effective manner. There exists a need, therefore, for an improved manufacturing testing technique for efficiently testing memories.

SUMMARY OF THE INVENTION

The present invention provides techniques for improved testing of memories. The improved memory test methodologies, in an illustrative embodiment, are capable of advantageously detecting a weak bit or bits in the memory primarily by disturbing small signal distinctions associated with individual bits in the memory with competing noise which is greater than a maximum anticipated noise that the memory will experience during normal operation. The competing noise is preferably provided by way of one or more competing words which are stored in a disturb memory array and read substantially simultaneously with one or more corresponding target words in the memory to be tested. Each of the bits forming the competing words has an output drive associated therewith that is preferably controllable. During, for example, a manufacturing test read operation, each of the bits forming a given target word is configured to overdrive the corresponding bits in the competing word. Thus, a predetermined noise margin can be ensured in the tested memory in a cost-effective manner.

In accordance with one aspect of the invention, a memory circuit, which may be used in a disturb memory array, includes a storage circuit configured for at least temporarily storing a logical state of the memory circuit, and a drive control circuit coupled to the storage circuit. The drive control circuit is configurable for selectively controlling an output drive of the memory circuit as desired. The memory circuit, in accordance with a preferred embodiment of the invention, may further include at least one pass gate coupled to the drive control circuit and connecting to at least one bit line corresponding to the memory circuit. The pass gate is operative to receive a first control signal and to control access to the storage circuit in response to the first control signal. The drive control circuit may include at least one variable resistance device operative to receive a second control signal, a resistance value of the variable resistance device being controlled as a function of the second control signal so as to provide a desired level of output drive of the memory circuit.

In accordance with another aspect of the invention, an integrated circuit includes one or more memory circuits having a controllable output drive. At least a given one of the memory circuits includes a storage circuit configured for at least temporarily storing a logical state associated with the memory circuit, and a drive control circuit coupled to the storage circuit. The drive control circuit is configurable for selectively controlling the output drive of the memory circuit as desired. The given memory circuit may further include one or more pass gates coupled to the drive control circuit and connecting to at least one bit line corresponding to the memory circuit. The pass gates are operative to receive a first control signal and to control access to the storage circuit in response to the first control signal.

These and other features and advantages of the present invention will become apparent from the following detailed description of illustrative embodiments thereof, which is to be read in connection with the accompanying drawings.

BRIEF DESCRIPTION OF THE DRAWINGS

FIG. 3 is a logical flow diagram illustrating an exemplary method for testing a memory circuit, in accordance with another aspect of the present invention.

FIG. 4 is a block diagram illustrating an exemplary system for implementing the methodologies of FIG. 3, in accordance with the present invention.

DETAILED DESCRIPTION OF THE PREFERRED EMBODIMENTS

Figure 1:
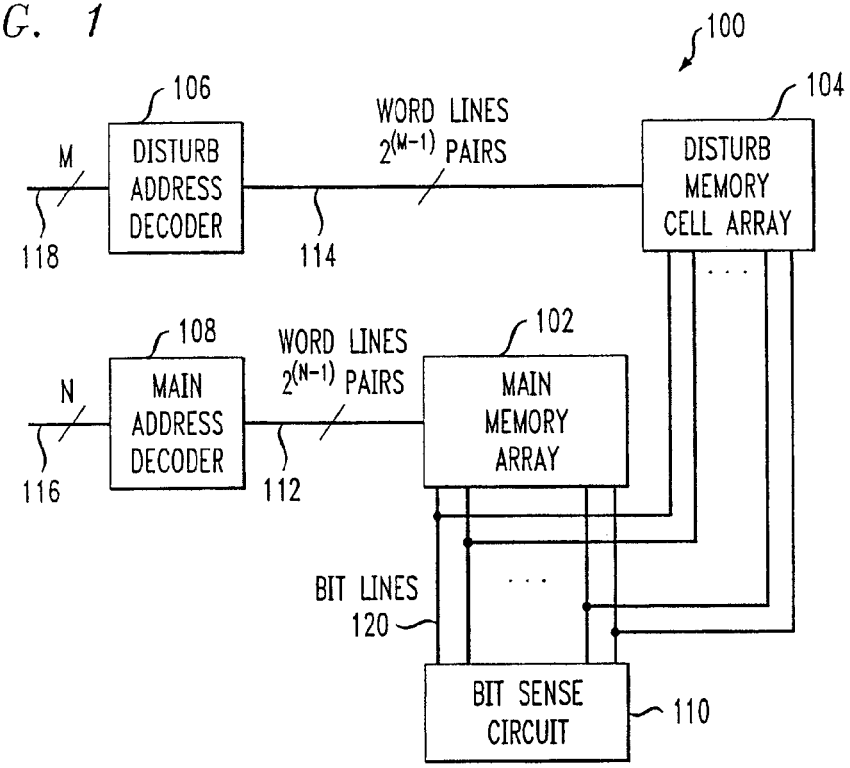
FIG. 1 is a block diagram illustrating an exemplary test circuit for testing a memory circuit, in accordance with one aspect of the present invention.

The present invention will be described herein in the context of an illustrative test circuit for efficiently testing memories. The test circuit may be used, for example, in conjunction with other analog and/or digital circuitry. It should be appreciated, however, that the present invention is not limited to this or any particular test circuit configuration and/or application. Rather, the invention is more generally applicable to techniques for testing memory circuits by presenting competing test words that are accessed substantially simultaneously with corresponding tested memory words. Moreover, although implementations of the present invention are described herein with specific reference to metal-oxide-semiconductor (MOS) transistor devices, it is to be appreciated that the invention is not limited to circuits configured using such MOS transistors, and that other suitable transistors, such as, for example, bipolar junction transistors (BJTs), may be similarly employed, as will be understood by those skilled in the art.

Most memory circuits rely, at least to some extent, on analog, rather than purely digital, electrical characteristics for proper function. These memory circuits are designed to discriminate between often small electrical signals (e.g., on the order of a few thousandths of the swing of digital signals) and noise, and to correctly make such distinctions over an acceptable range of IC manufacturing process variation, or variations in other conditions, such as, but not limited to, supply voltage, temperature, clock frequency, etc.

Conventional memory testing methodologies are generally not able to efficiently detect a weak bit in a memory array, especially on a bit-by-bit basis. A weak bit as the term is used herein is intended to refer to a bit corresponding to a memory cell in the memory array which lacks an output drive capability to reliably make a small signal distinction between the information stored in the memory cell and noise which the memory cell may be subjected to during its normal operation. In order to detect a defective or weak bit in the memory array, the memory testing techniques of the present invention preferably disturb the small signal distinctions associated with a selected bit or bits with competing noise which is greater than an anticipated maximum noise that the memory will experience during normal operation. Thus, in accordance with an illustrative embodiment of the invention, during memory testing, tested memory words stored in a first or main memory are preferably accessed (i.e., read) substantially simultaneously with competing words stored in a second or disturb memory, thereby imposing a controllable noise on the tested memory words and forcing the tested memory words in the first memory to have a higher drive capability than the competing words, or otherwise failing the first memory under test. The term "memory" as used herein is intended to refer to any storage device or medium. Furthermore, at least a portion of the first and second memories may be implemented in a single memory. The testing methodology of the present invention can be advantageously performed on a bit-by-bit basis and ensures that there is a desired guard band of noise within which the tested memory will continue to function correctly.

FIG. 1 illustrates an exemplary test circuit 100, formed in accordance with one aspect of the invention. The test circuit 100 preferably includes a main memory array 102 and a corresponding main address decoder 108, a disturb memory array 104 and corresponding disturb address decoder 106, and a bit sense circuit 110. As previously stated, although depicted as separate circuits in the figure, at least a portion of the main memory and disturb memory may be implemented as a single memory. The main memory array 102 preferably comprises $2^{(N-1)}$ memory cells, where N is an integer greater than zero. The memory cells are not individually shown in the figure. It is to be understood that the present invention is not limited to the number and/or arrangement of memory cells, and thus is not limited to array sizes that are powers of two, as in the illustrative test circuit 100. The main memory array 102, which represents the memory to be tested, includes a plurality of word lines 112 and bit lines 120 for selectively accessing one or more of the memory cells. Main memory array 102 may be implemented as a conventional memory, as will be understood by those skilled in the art. During a write operation, data may be stored in one or more selected memory cells in the main memory array 102 in a conventional manner, such as, for example, by accessing the main memory array via a write signal presented to word lines 112 which is generated by the main address decoder 108 coupled to the main memory array 102.

The main address decoder 108, which may be implemented as a conventional decoder, is preferably configured to receive a k-bit input address 116 and outputs the corresponding write signal to word lines 112 for accessing one or more of the $2^{(N-1)}$ memory cells in the main memory array, where k is an integer representing the number of bits to be accessed. Preferably, the word line signal generated by the main address decoder 108 includes a pair of signals WORD and $\overline{\text{WORD}}$, each of the signals being a complement of one another. It is to be appreciated that if the main memory array is read-only, the contents of the memory are predetermined and therefore no write operation of the main memory array is necessary. During a read operation, the bit sense circuit 110, which is operatively coupled to the main memory array 102, is preferably enabled for determining the data stored in a selected memory location(s).

The disturb memory array 104 comprises $2^{(M-1)}$ disturb memory cells, where M is an integer greater than zero and less than or equal to N. The memory cells are not individually shown in the figure. Preferably, the size of the disturb memory array is substantially smaller than the main memory array. The disturb memory cells associated with the disturb memory array are preferably selectively accessed via a plurality of disturb word lines 114 and bit lines 120 which are preferably connected to corresponding bit lines associated with the main memory array 102. Data may be written to the disturb memory array 104 in a conventional manner, such as by presenting an appropriate write signal or signals on disturb word lines 114. The write signals for accessing the disturb memory array 104 may be generated by the disturb address decoder 106 coupled to the disturb memory array 104. The disturb address decoder 106 preferably receives an M-bit input address 118 and generates the corresponding write signal(s) for accessing one or more of the $2^{(M-1)}$ disturb memory cells in the disturb memory array 104. Similar to the main address decoder previously described, the write signal generated by the disturb address decoder 106 preferably includes a pair of signals WORD and $\overline{\text{WORD}}$, each of the signals being a complement of one another. The disturb address decoder 106 may be implemented in a manner consistent with the main address decoder 108 described above. Data may be selectively read from the disturb memory array 104 via the plurality of bits lines 120 coupled to the bit sense circuit 110.

The test circuit 100 is preferably configured such that when a test pattern (e.g., comprised of a plurality of sequential test words) is run, e.g., by an on-chip BIST, by an IC test machine, or other suitable mechanism, the disturb memory array 104 and corresponding disturb address decoder 106 are employed in conjunction with the main memory array 102 and corresponding main address decoder 108. During normal operation or when a test is not running, the disturb memory array 104 and disturb address decoder 106, as well as any other circuitry that may be used exclusively for testing, are preferably disabled, such as, for example, by deactivating the disturb word lines 114. Since the bit lines 120 connected to the bit sense circuit 110 are coupled to both the main memory array 102 and the disturb memory array 104, whenever a particular bit location in the main memory array 102 is selected for a read operation, data in a corresponding bit location in the disturb memory array 104 will be simultaneously output on bit lines 120. Thus, the data read by the bit sense circuit 110 for a selected bit location will preferably be a summation of data from both the main memory array and the disturb memory array.

The data written into the disturb memory array 104 is preferably a complement of the data written into the main memory array 102 for a corresponding bit location. Thus, in order for the bit sense circuit 110 to yield the correct (i.e., expected) data associated with a selected bit in the main memory array, the memory cell in the main memory array associated with the selected bit is configured to overdrive the corresponding disturb memory cell in the disturb memory array. If the correct data is read by the bit sense circuit for a selected bit location, this indicates that there is sufficient overdrive margin associated with the selected bit in the main memory array.

Figure 2:
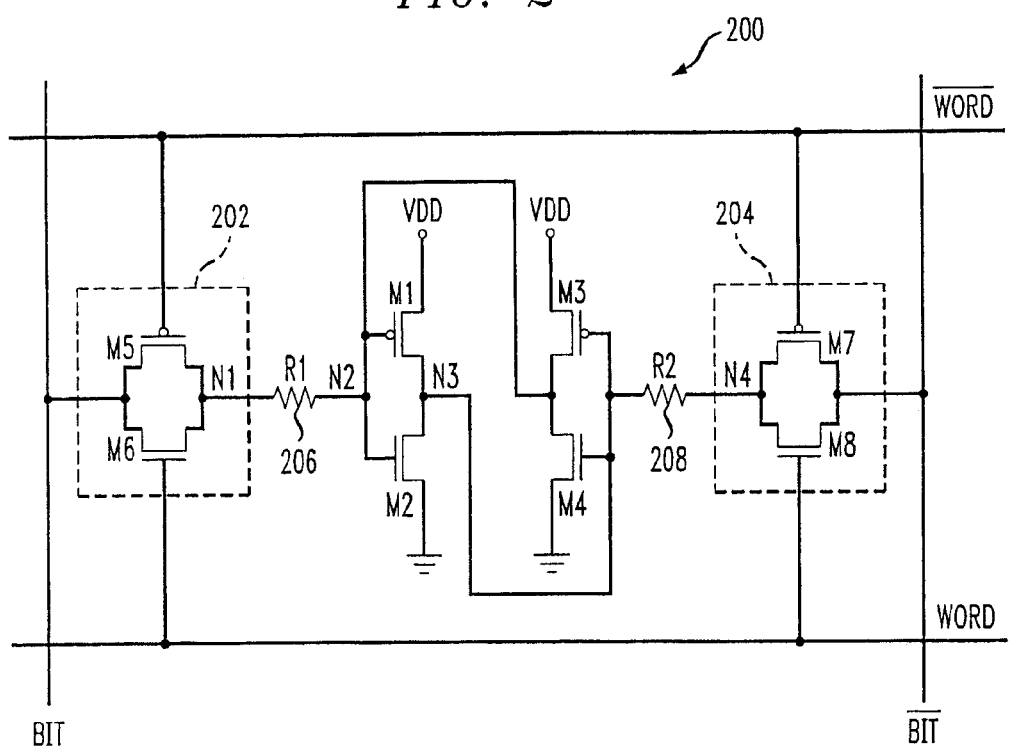
FIG. 2 is a schematic diagram depicting an exemplary disturb memory cell implementation for use in a memory circuit testable using the techniques of the present invention.

FIG. 2 illustrates an exemplary disturb memory cell 200, formed in accordance with one aspect of the present invention. As apparent from the figure, the illustrative disturb memory cell is a static RAM. It is to be appreciated, however, that alternative memory cell structures may be similarly employed with the present invention, such as, but not limited to, dynamic random access memory (DRAM), ROM, etc. As in the case for the main memory array, if the disturb memory cell is read-only, the logic state of the cell is predetermined, and thus the write operation is not required. The illustrative disturb memory cell 200 includes a pair of cross-coupled inverters connected by pass transistors to complementary bit lines BIT and $\overline{\text{BIT}}$. The pair of cross-coupled inverters comprises a p-type metal-oxide-semiconductor (PMOS) transistor M1 and an n-type metal-oxide-semiconductor (NMOS) transistor M2 operatively connected together to form a first inverter of the pair of cross-coupled inverters, and a PMOS transistor M3 and an NMOS transistor M4 operatively connected together to form a second inverter of the pair of cross-coupled inverters. Specifically, the pair of inverters are connected such that an input of the first inverter at node N2 is connected to an output of the second inverter, and an output of the first inverter at node N3 is connected to an input of the second inverter.

The disturb memory cell 200 further includes a pair of complementary metal-oxide-semiconductor (CMOS) pass gates 202 and 204 for selectively accessing the memory cell. Each pass gate 202, 204 essentially functions as a switch having at least one control input for selectively providing an electrical connection between a first terminal and a second terminal of the pass device in response to a control signal supplied to the control input. Pass device 202 preferably includes a PMOS pass transistor M5 connected in parallel with an NMOS pass transistor M6. The first terminal of pass gate 202, which may be formed at a junction of drain terminals of transistors M5 and M6, is connected to bit line BIT, while the second terminal of pass gate 202, which may be formed at a junction of source terminals of transistors M5 and M6, is coupled to a first access resistor 206 at node N1 having a resistance R1. Since the MOS transistors are bidirectional devices, the designation of source and drain terminals of each transistor is arbitrary. Resistor 206 is connected to the input of the first inverter at node N2. Likewise, pass gate 204 preferably includes a PMOS pass transistor M7 connected in parallel with an NMOS pass transistor M8. The first terminal of pass gate 204, which may be formed at a junction of drain terminals of transistors M7 and M8, is preferably connected to complementary bit line $\overline{\text{BIT}}$, while the second terminal of pass gate 204, which may be formed at a junction of source terminals of transistors M7 and M8, is coupled to a second access resistor 208 at node N4 having a resistance R2. Resistor 208 is connected to the input of the second inverter at node N3. Access resistors 206 and 208 preferably form drive control circuitry for controlling a drive capability of the disturb memory cell 200, as will be explained in further detail below.

The disturb memory cell 200 preferably includes a pair of complementary word lines WORD and $\overline{\text{WORD}}$ which convey control signals for selectively accessing the cell. Word line WORD is coupled to gate terminals of NMOS pass transistors M6 and M8, while complementary word line $\overline{\text{WORD}}$ is connected to gate terminals of PMOS pass transistors M5 and M7. In this manner, the disturb memory cell 200 may be accessed when word lines WORD and $\overline{\text{WORD}}$ are at a logic high level, which may be VDD, and a logic low level, which may be ground, respectively.

One or more of the disturb memory cells may be implemented in a manner consistent with, for example, a conventional static RAM cell, with the exception of access resistors 206 and 208 which are not included in the conventional memory cell. The drive capability of each of the disturb memory cells must be selected so as to be representative of the maximum noise which the memory device will experience. If the drive capability of the disturb memory cells is made too high (e.g., greater than the anticipated maximum noise to which the memory device may be subjected), the memory device may be failed, or otherwise forced to have an overdrive margin that is greater than necessary, thus undesirably lowering the yield. As previously stated, access resistors 206 and 208 preferably form a drive control circuit used to control a drive capability of the given disturb memory cell 200. It is to be understood that the present invention is not limited to the drive control circuitry described herein, and that alternative drive control circuits may be employed.

The disturb memory array preferably generates a competing word which imposes a predetermined noise on the main memory array. In accordance with the invention, the access resistors 206, 208 in each disturb memory cell 200 are controlled to provide a desired level of competing noise, with respect to a corresponding memory cell in the main memory array. Preferably, each of the access resistors 206 and 208 are adjusted to have a resistance which is about 2 to 20 times the parasitic resistance which exists between a bit line and an input of one of the cross-coupled inverters in a corresponding main memory cell. Additionally, each of the disturb memory cells are preferably substantially matched to a corresponding memory cell (not shown) in the main memory array, with the exception of the presence of access resistors 206 and 208 in the disturb memory cell. By matching a particular main memory cell with a corresponding disturb memory cell, a ratio of the drive capability of the main memory cell and a drive capability of the corresponding disturb memory cell will remain substantially the same, regardless of variations in conditions, such as, for example, IC processing, temperature, supply voltage, clock frequency, etc.

The desired resistance values R1, R2 selected for the access resistors 206, 208, respectively, may take into account not merely the values of the physical resistors themselves, but such access resistors may be implemented, at least in part, in the form of parasitic resistance, such as, for example, a drain-to-source resistance of the pass gates 202, 204, and interconnect resistance. Assuming such parasitic resistance is substantially the same as the parasitic resistance present in the corresponding main memory cell, the resistance values R1, R2 chosen for the access resistors will directly correlate to the drive ratio between the main memory cell and disturb memory cell.

The present invention contemplates that the access resistors in one or more disturb memory cells may be alternatively implemented using, for example, a variable resistance device (not shown) capable of providing a desired resistance in response to one or more control signals presented thereto, as will be understood by those skilled in the art. In this manner, the competing noise imposed on a given bit(s) can be operatively controlled during testing to provide characterization information relating to the memory device. For instance, a given disturb memory cell may be configured such that the access resistance, and thus drive capability, associated with the disturb memory cell may be controlled by way of a digital word stored in a register. This may be implemented, for example, using a voltage controlled resistor in conjunction with a digital-to-analog converter (not shown), as will be understood by those skilled in the art.

In accordance with another aspect of the invention, an exemplary method 300 for performing improved testing of a memory device or circuit is illustrated by the flow diagram of FIG. 3. The exemplary method 300 is preferably performed for each of a set of goal bit patterns, and for each of all possible target words in the memory. In step 302, at least one goal bit pattern is written to one or more available disturb words in the disturb memory array. Optionally, at least one contrasting bit pattern may be written to any remaining available disturb words in step 304. A contrasting bit pattern may be written to neighboring and target words in the main memory instep 306. In step 308, the goal bit pattern is written to the target words in the main memory. A contrasting bit pattern may be written to neighboring words in the main memory in step 310. In step 312, each of the neighboring words and corresponding disturb words holding the goal bit pattern are preferably simultaneously read and the result is checked to confirm that the neighboring words hold the contrasting bit pattern. If the result is incorrect, the memory device is failed and the test may be stopped at this point. The target words and the disturb words, which hold a contrasting bit pattern, are simultaneously read in step 314 and the result is then checked to confirm that the target words hold the goal bit pattern. If not, the memory device is failed and the test may be stopped. In step 316, each of the neighboring words and the corresponding disturb words holding the goal bit pattern are preferably read simultaneously and the result is checked to confirm that the neighboring words hold the contrasting bit pattern. An incorrect result at any point throughout the test yields a failed memory device.

FIG. 4 illustrates an exemplary system 400 for implementing at least a portion of the methodologies shown in FIG. 3. The system 400 preferably includes a processor, memory 402 and input/output (I/O) devices 404 coupled to the processor, which may be used to run application programs for controlling the testing of memory. It is to be appreciated that the term "processor" as used herein is intended to include any processing device, such as, for example, one that includes a central processing unit (CPU) and/or other processing circuitry (e.g., microprocessor). Additionally, it is to be understood that the term "processor" may refer to more than one processing device, and that various other elements associated with a processing device may be shared by other processing devices. The term "memory" as used herein is intended to include memory and other computer-readable media associated with a processor or CPU, such as, for example, RAM, ROM, fixed storage media (e.g., a hard drive), removable storage media (e.g., diskette), flash memory, etc. Furthermore, the term "input/output devices" or "I/O devices' as used herein is intended to include, for example, one or more input devices (e.g., keyboard, mouse, etc.) for entering data to the processor, and/or one or more output devices (e.g., monitor, printer, etc.) for presenting the results associated with the processor.

Accordingly, an application program, or software components thereof, including instructions or code for performing at least a portion of the methodologies of the invention, as described above in connection with FIG. 3, may be stored in one or more of the associated storage media (e.g., ROM, fixed or removable storage) and, when ready to be utilized, loaded in whole or in part (e.g., into RAM) and executed by the processor.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory circuit having a controllable output drive, the memory circuit comprising:
   a storage circuit configured for at least temporarily storing a logical state of the memory circuit; and
   a drive control circuit coupled to the storage circuit, the drive control circuit being configurable for selectively controlling an output drive capability of the memory circuit.

2. The memory circuit of claim 1, further comprising at least one pass gate coupled to the drive control circuit and connecting to at least one bit line corresponding to the memory circuit, the at least one pass gate being operative to receive a first control signal and to control access to the storage circuit in response to the first control signal.

3. The memory circuit of claim 2, wherein the at least one pass gate comprises:
   a first pass gate operative to connect a first node of the drive control circuit to a first bit line corresponding to the memory circuit; and a second pass gate operative to connect a second node of the drive control circuit to a second bit line corresponding to the memory circuit.

4. The memory circuit of claim 2, wherein the drive control circuit is connected between the at least one pass gate and the storage circuit.

5. The memory circuit of claim 2, wherein:
the drive control circuit comprises first and second resistors, a first end of the first resistor being connected to a first node of the storage circuit, a first end of the second resistor being connected to a second node of the storage circuit; and
the at least one pass gate comprises a first pass gate operative to connect a second end of the first resistor to a first bit line corresponding to the memory circuit in response to the first control signal, and a second pass gate operative to connect a second end of the second resistor to a second bit line corresponding to the memory circuit in response to the first control signal.

6. The memory circuit of claim 5, wherein the first control signal is conveyed via a word line corresponding to the memory circuit.

7. The memory circuit of claim 1, wherein the drive control circuit is operative to receive a second control signal and to selectively control the output drive of the memory circuit as a function of the second control signal.

8. The memory circuit of claim 1, wherein the storage circuit comprises a first logic gate and a second logic gate, the first and second logic gates being connected together in a cross-coupled arrangement.

9. The memory circuit of claim 1, wherein the storage circuit comprises first and second inverters, an input of the first inverter being connected to a first node of the drive control circuit, an output of the first inverter being connected to an input of the second inverter, the input of the second inverter being connected to a second node of the drive circuit, and an output of the second inverter being connected to the input of the first inverter.

10. The memory circuit of claim 1, wherein the output drive of the memory circuit substantially matches an anticipated maximum noise to which the memory circuit may be subjected.

11. The memory circuit of claim 1, wherein the drive control circuit comprises at least one resistor, the at least one resistor having a resistance value selected so as to provide a desired level of output drive of the memory circuit.

12. The memory circuit of claim 1, wherein the drive control circuit comprises at least one variable resistance device operative to receive a second control signal, a resistance value of the at least one variable resistance device being controlled as a function of the second control signal so as to provide a desired level of output drive of the memory circuit.

13. An integrated circuit including at least one memory cell having a controllable output drive, the at least one memory cell comprising:

a storage circuit configured for at least temporarily storing a logical state of the memory circuit; and
a drive control circuit coupled to the storage circuit, the drive control circuit being configurable for selectively controlling an output drive capability of the memory circuit.

14. The integrated circuit of claim 13, wherein the at least one memory circuit further comprises at least one pass gate coupled to the drive control circuit and connecting to at least one bit line corresponding to the memory circuit, the at least one pass gate being operative to receive a first control signal and to control access to the storage circuit in response to the first control signal.

15. The integrated circuit of claim 14, wherein the at least one pass gate comprises:
a first pass gate operative to connect a first node of the drive control circuit to a first bit line corresponding to the memory circuit; and
a second pass gate operative to connect a second node of the drive control circuit to a second bit line corresponding to the memory circuit.

16. The integrated circuit of claim 14, wherein:
the drive control circuit comprises first and second resistors, a first end of the first resistor being connected to a first node of the storage circuit, a first end of the second resistor being connected to a second node of the storage circuit; and
the at least one pass gate comprises a first pass gate operative to connect a second end of the first resistor to a first bit line corresponding to the at least one memory circuit in response to the first control signal, and a second pass gate operative to connect a second end of the second resistor to a second hit line corresponding to the at least one memory circuit in response to the first control signal.

17. The integrated circuit of claim 13, wherein the drive control circuit is operative to receive a second control signal and to selectively control the output drive of the memory circuit as a function of the second control signal.

18. The integrated circuit of claim 13, wherein the storage circuit comprises a first logic gate and a second logic gate, the first and second logic gates being connected together in a cross-coupled arrangement.

19. The integrated circuit of claim 13, wherein the output drive of the at least one memory circuit substantially matches an anticipated maximum noise to which the memory circuit may be subjected.

20. The integrated circuit of claim 13, wherein the drive control circuit comprises at least one variable resistance device operative to receive a second control signal, a resistance value of the at least one variable resistance device being controlled as a function of the second control signal so as to provide a desired level of output drive of the at least one memory circuit.

* * * * *